United States Patent
Lee et al.

(10) Patent No.: US 12,057,844 B2
(45) Date of Patent: Aug. 6, 2024

(54) DIGITAL DROOP DETECTOR, SEMICONDUCTOR DEVICE INCLUDING THE SAME, AND CALIBRATION METHOD THEREOF

(71) Applicant: Samsung Electronics Co., Ltd., Suwon-si (KR)

(72) Inventors: Sangheon Lee, Suwon-si (KR); Heewook Shin, Suwon-si (KR); Heejune Lee, Suwon-si (KR); Jungho Lee, Suwon-si (KR); Youngjae Cho, Suwon-si (KR); Michael Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/176,371

(22) Filed: Feb. 28, 2023

(65) Prior Publication Data

US 2024/0072782 A1   Feb. 29, 2024

(30) Foreign Application Priority Data

Aug. 31, 2022  (KR) .................. 10-2022-0109559

(51) Int. Cl.
*H03K 5/135* (2006.01)
*G01R 19/25* (2006.01)
*H03K 5/00* (2006.01)

(52) U.S. Cl.
CPC ......... *H03K 5/135* (2013.01); *G01R 19/2513* (2013.01); *H03K 2005/00052* (2013.01)

(58) Field of Classification Search
None
See application file for complete search history.

(56) References Cited

U.S. PATENT DOCUMENTS

| 8,164,493 B2 | 4/2012 | Hsieh |
| 8,669,794 B2 | 3/2014 | Park et al. |
| 8,847,777 B2 | 9/2014 | Ramaswami |
| (Continued) | | |

FOREIGN PATENT DOCUMENTS

KR   101300828 B1   8/2013

OTHER PUBLICATIONS

Bang et al., "An All-Digital, $V_{MAX}$-Compliant, Stable, and Scalable Distributed Charge Injection Scheme in 10-nm CMOS for Fast and Local Mitigation of Voltage Droop," IEEE Journal of Solid-State Circuits, vol. 55, No. 7, Jul. 2020, p. 1898-1908.

(Continued)

*Primary Examiner* — Cassandra F Cox
(74) *Attorney, Agent, or Firm* — Harness, Dickey & Pierce, P.L.C.

(57) ABSTRACT

A digital droop detector for detecting whether a droop occurs in a power supply voltage, may include processing circuitry configured to, detect a voltage level change of a power supply voltage in response to a clock signal, the detecting the voltage level change including converting the detected voltage level change into a first code, correct at least one nonlinearity included in the first code, the correcting including converting the first code into a second code and a target range, and adjust a delay magnitude of the clock signal based on the second code.

17 Claims, 16 Drawing Sheets

(56) References Cited

U.S. PATENT DOCUMENTS

| | | | |
|---|---|---|---|
| 9,104,181 B1 | 8/2015 | Jung et al. | |
| 9,490,831 B2 | 11/2016 | Kim et al. | |
| 9,628,089 B1 | 4/2017 | Jain et al. | |
| 9,772,375 B2 | 9/2017 | Turullols et al. | |
| 10,222,847 B2 | 3/2019 | Kitaji et al. | |
| 10,686,582 B1 | 6/2020 | Pasdast et al. | |
| 10,782,763 B2 | 9/2020 | Kitaji et al. | |
| 11,249,530 B1 | 2/2022 | Pal et al. | |
| 2017/0075404 A1 | 3/2017 | Kitaji et al. | |
| 2017/0301381 A1 | 10/2017 | Seomun et al. | |
| 2019/0317546 A1* | 10/2019 | Born | G06F 1/08 |
| 2020/0001887 A1* | 1/2020 | Srivastava | B60W 50/0205 |
| 2020/0007082 A1* | 1/2020 | Robinson | H03B 5/06 |
| 2020/0089299 A1 | 3/2020 | Kim et al. | |
| 2021/0242872 A1 | 8/2021 | Bang et al. | |
| 2022/0006459 A1* | 1/2022 | Bautista Gabriel | G01R 19/16552 |
| 2022/0147096 A1 | 5/2022 | Kim et al. | |
| 2022/0166431 A1* | 5/2022 | Shor | G06F 1/3234 |

OTHER PUBLICATIONS

European Extended Search Report for corresponding European Patent Application No. 23173227.2 issued on Jan. 24, 2024.

\* cited by examiner

DIGITAL DROOP DETECTOR, SEMICONDUCTOR DEVICE INCLUDING THE SAME, AND CALIBRATION METHOD THEREOF

CROSS-REFERENCE TO RELATED APPLICATIONS

This U.S. non-provisional application claims the benefit of priority under 35 U.S.C. § 119 to Korean Patent Application No. 10-2022-0109559 filed on Aug. 31, 2022, in the Korean Intellectual Property Office, the disclosure of which is incorporated by reference herein in its entirety.

BACKGROUND

As the degree of integration and/or size of semiconductor devices increases, and the operating speed increases, power consumption also increases correspondingly. Accordingly, low-power performance of semiconductor devices is becoming increasingly important. A system on chip (SoC), such as an application processor includes high-performance functional blocks (or Intellectual Property (IP) blocks, IP cores, etc.). A power supply voltage provided to these functional blocks may vary according to an operating environment or a level of a task. In general, in order to prepare for a droop phenomenon in which the power supply voltage is greatly reduced, a guard band providing a sufficient margin to the power supply voltage is set. However, setting a relatively high guard band increases the power consumption of the SoC, which may weaken the competitiveness of the product.

The integrated digital circuit consumes a lot of power to operate at high speed. At this time, a droop of the power supply voltage occurs due to a sudden change in the load current. By detecting the droop of the supply voltage and adjusting the clock, it is possible to quickly restore the supply voltage. In order to decrease and/or prevent malfunction of digital circuits due to droop, it is desired and/or necessary to accurately detect the droop.

A digital droop detector (hereinafter, DDD) is widely used because it can be placed around a digital circuit since it uses a digital standard cell library during the digital circuit design process. However, the digital droop detector DDD is vulnerable to process/temperature changes. Accordingly, there is a need for a technology capable of effectively compensating for changes in process/temperature in a digital droop detector DDD used in digital functional blocks of a semiconductor device.

SUMMARY

Various example embodiments of the inventive concepts relate to a digital droop detector for detecting whether a droop occurs in a power supply voltage, a semiconductor device including the same, and/or a calibration method for the digital droop detector, etc.

A digital droop detector may include processing circuitry configured to, detect a voltage level change of a power supply voltage in response to a clock signal, the detecting the voltage level change including converting the detected voltage level change into a first code, correct at least one nonlinearity included in the first code, the correcting including converting the first code into a second code and a target range, and adjust a delay magnitude of the clock signal based on the second code.

A semiconductor device, comprising, at least one intellectual property (IP) core configured to receive a power supply voltage to perform at least one processing operation, a digital droop detector configured to detect a droop of the power supply voltage and output a droop detection signal, a clock modulation circuit configured to generate an adaptive clock signal based on an input clock signal by varying a frequency of the input clock signal in response to the droop detection signal, and provide the adaptive clock signal to the IP core, and the digital droop detector is further configured to, convert a voltage level change of the power supply voltage into a first code, convert at least one nonlinearity included in the first code into a second code based on a target range, and adjust a delay magnitude of the adaptive clock signal based on the second code.

A calibration method of a digital droop detector, the method comprising, detecting a voltage level change of a power supply voltage, generating an output code based on the detected voltage level change of the power supply voltage, generating a process correction code by correcting process variation related nonlinearities of the output code by applying a three-point calibration technique, generating a temperature correction code by correcting temperature related nonlinearities in the process correction code by applying a two-point calibration technique, and adjusting a delay of a clock signal based on the process correction code.

BRIEF DESCRIPTION OF THE FIGURES

The above and other objects and features of the example embodiments of the inventive concepts will become apparent by describing in detail various example embodiments thereof with reference to the accompanying drawings.

DETAILED DESCRIPTION

It is to be understood that both the foregoing general description and the following detailed description of various example embodiments are examples only, and the inventive concepts are not limited thereto. Reference signs are indicated in detail in example embodiments of the inventive concepts, examples of which are indicated in the reference drawings. Wherever possible, the same reference numbers are used in the description and drawings to refer to the same or like parts.

Figure 1:
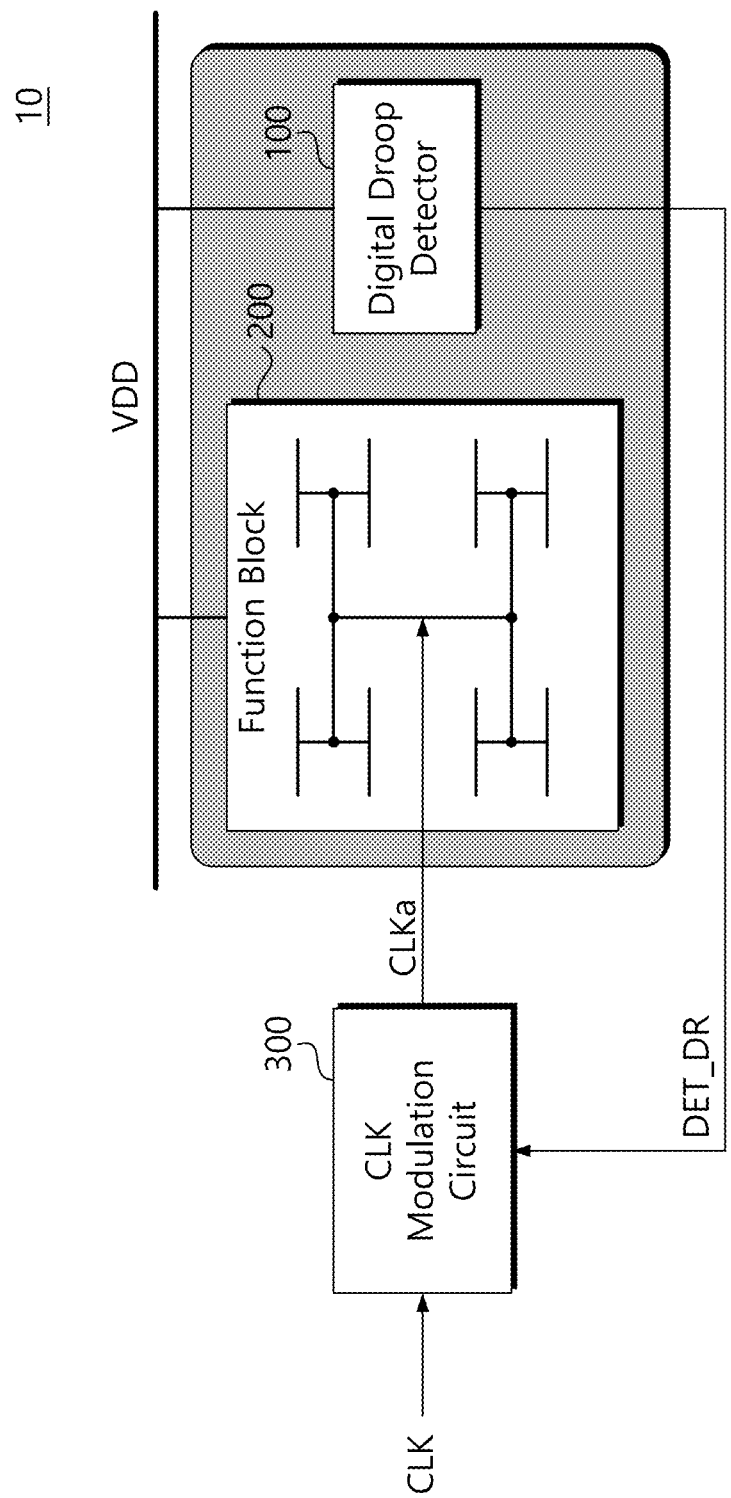
FIG. 1 is a block diagram illustrating a semiconductor device including a digital droop detector according to at least one example embodiment of the inventive concepts.

FIG. 1 is a block diagram illustrating a semiconductor device including a digital droop detector according to at least one example embodiment of the inventive concepts. Referring to FIG. 1, a semiconductor device 10 of the inventive concepts may include a digital droop detector 100, at least one function block 200 (e.g., IP block, IP core, etc.), and/or a clock modulation circuit 300, etc., but the example embodiments are not limited thereto, and for example, the semiconductor device 10 may include a greater or lesser number of constituent elements. The semiconductor device 10 may be an adaptive clock system which detects a droop (e.g., decrease, temporary decrease, etc.) of the power supply voltage VDD, modulates the clock signal CLK adaptively, and provides the modulated clock signal CLK to the function block 200, etc.

The digital droop detector 100 monitors the power supply voltage VDD transmitted through a power line, etc. The digital droop detector 100 generates a droop detection signal DET_DR indicating whether a droop is detected and/or has occurred in the power supply voltage VDD through monitoring. The generated droop detection signal DET_DR is transmitted to the clock modulation circuit 300, but is not limited thereto. For example, the digital droop detector 100 may generate a high (H) level droop detection signal DET_DR when the power supply voltage VDD falls below a reference value and/or a desired threshold value, etc., but the example embodiments are not limited thereto. On the other hand, the digital droop detector 100 may generate a low (L) level droop detection signal DET_DR when the power supply voltage VDD is equal to or greater than the reference voltage, etc., but the example embodiments are not limited thereto.

In at least one example embodiment, the digital droop detector 100 may use a plurality of reference voltages of different voltage levels. The digital droop detector 100 may use a plurality of reference voltages to generate the droop detection signal DET_DR indicating whether or not a droop has occurred and/or is occurring in the power supply voltage VDD and the degree of droop (e.g., the detected amount of droop, etc.). In this case, the clock modulation circuit 300 may adjust the frequency of the clock signal CLK according to and/or based on the detected degree of droop of the power voltage VDD, etc., but is not limited thereto. For example, the clock modulation circuit 300 may linearly lower the frequency of the clock signal CLK as the degree of droop of the power voltage VDD increases. Also, the clock modulation circuit 300 may adjust the frequency of the clock signal CLK to adaptively increase as the drooped power voltage VDD is recovered (e.g., returns to the expected and/or desired voltage VDD level). The adjusted clock signal will be referred to as an adaptive clock signal CLKa hereinafter.

The function block 200 performs various processing and/or functionality using the power supply voltage VDD transmitted through the power line, but is not limited thereto. In addition, the function block 200 performs at least one processing operation in synchronization with the adaptive clock signal CLKa provided from the clock modulation circuit 300, but is not limited thereto. The adaptive clock signal CLKa is transmitted to detailed circuits in the function block 200 along the clock path CLK_Path, etc. While a single function block 200 is shown in FIG. 1, the example embodiments are not limited thereto, and for example, there may be a plurality of function blocks, etc.

When a droop (e.g., decrease, change, etc.) of the power supply voltage VDD occurs, the function block 200 performs at least one processing operation based on the adaptive clock signal CLKa having a lower frequency than the previous, desired, and/or expected frequency. Through this, the power consumption of the functional block 200 may be reduced, and the level of the power supply voltage VDD may be restored (e.g., the voltage level of VDD may return to the previous, desired, and/or expected level). The stable operation of the semiconductor device 10 is possible through recovery from the droop of the power supply voltage VDD. According to and/or based on the use of the adaptive clock signal CLKa, a margin of the power supply voltage VDD for preparing for droop may be reduced. Accordingly, it is possible to reduce the overall amount of power consumed by the semiconductor device 10, etc., while also allowing for the functional block 200 to continue operation without having to be stopped, etc.

The function block 200 may be a circuit and/or block that performs at least one specific function, and may be referred to as an IP (Intellectual Property), IP core, IP block, etc. For example, the function block 200, in whole or in part, may be implemented as processing circuitry, and may include hardware including logic circuits; a hardware/software combination such as a processor executing software and/or firmware; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc., but is not limited thereto. Additionally, the functional block 200 may be a wide range of semiconductor devices, such as a central processing unit, a graphic processing unit, and/or an application processor, etc.

The clock modulation circuit 300 may modulate the clock signal CLK into the adaptive clock signal CLKa in response to and/or based on the droop detection signal DET_DR, and may provide the adaptive clock signal CLKa to the functional block 200, etc., but is not limited thereto. For example, the clock modulation circuit 300 provides the adaptive clock signal CLKa with a reduced frequency (e.g., changed frequency, modified frequency, adjusted frequency, etc.) to the function block 200 in response to the droop detection signal DET_DR indicating that a droop of the power supply voltage VDD has occurred. Additionally, the clock modulation circuit 300 may pass the unmodulated clock signal CLK to the function block 200, etc., in response to the droop detection signal DET_DR when there is no droop of the power supply voltage VDD.

As described above, the semiconductor device 10 according to at least one example embodiment of the inventive concepts includes the digital droop detector 100 capable of compensating for changes in process and/or temperature of the semiconductor device 10 and/or the functional block 200, etc. Accordingly, a relatively reduced margin of the power supply voltage VDD may be used, thereby reducing power consumption of the semiconductor device 10 and/or improving reliability and/or the operation time of the semiconductor device 10, etc.

Figure 2:
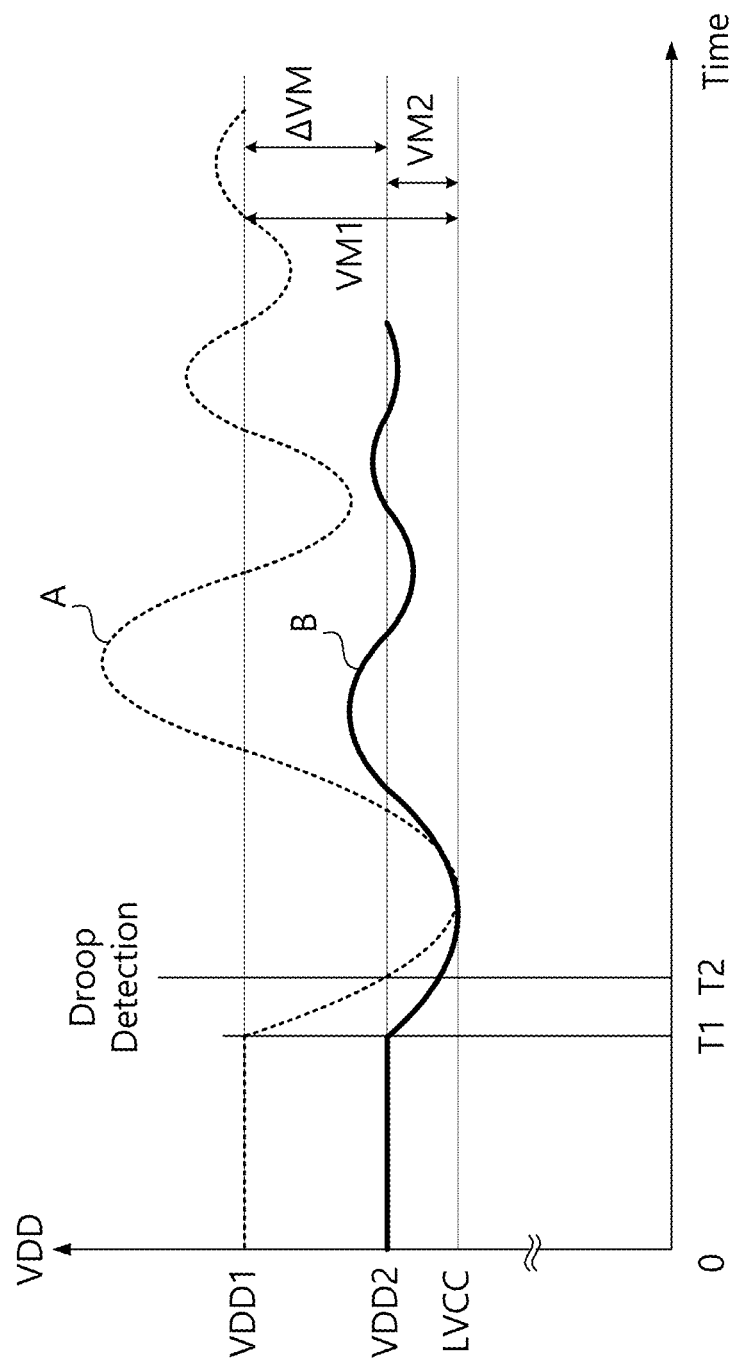
FIG. 2 is a waveform diagram showing an effect of reducing a margin of a power supply voltage according to an adaptive clock signal based on the digital droop detector of at least one example embodiment.

FIG. 2 is a waveform diagram showing an effect of reducing a margin of a power supply voltage according to and/or based on an adaptive clock signal based on the digital droop detector of at least one example embodiment of the inventive concepts. Referring to FIG. 2, in addition to the use of the adaptive clock signal, the digital droop detector 100 may perform calibration to compensate for the effect of process and/or temperature to increase the resolution of droop detection. Accordingly, when the digital droop detector 100 of one or more example embodiments of the inventive concepts is applied, the margin of the power supply voltage VDD supplied to the function block 200 may be reduced. Therefore, when the digital droop detector 100 of one or more example embodiments of the inventive concepts is applied, power consumption caused by the margin of the power supply voltage VDD may be reduced.

The minimum supply voltage LVCC refers to a desired lower threshold and/or minimum voltage which does not affect the function and/or performance of the function block 200 when a power control operation such as dynamic voltage-frequency scaling DVFS, etc., is applied, but the example embodiments are not limited thereto. In addition, the first power supply voltage VDD1 is a power supply voltage to which the first margin VM1 desired and/or required when the digital droop detector 100 of the inventive concepts is not used. The first power voltage VDD1 has a value (e.g., voltage level, etc.) which is obtained by adding a relatively large first margin VM1 to the minimum supply voltage LVCC, or in other words, the first power voltage VDD1 is composed of the first margin VM1 voltage and the minimum supply voltage LVCC. On the other hand, the second power supply voltage VDD2 shows a reduced level (e.g., lower voltage level) of the power supply voltage by using the adaptive clock signal and the calibration technique of one or more example embodiments of the inventive concepts. The second power voltage VDD2 has a value (e.g., a voltage level) obtained by adding a relatively small second margin VM2 to the minimum supply voltage LVCC, or in other words, the second power voltage VDD2 is composed of the smaller second margin VM2 voltage and the minimum supply voltage LVCC. That is, when the adaptive clock signal is used, the power supply voltage VDD may be reduced by the margin gain ΔVM, and therefore power consumption may be reduced, etc.

When the droop occurs at the time T1 and the droop is detected at the time T2, the waveform of the first power voltage VDD1 that does not use the adaptive clock signal appears as an 'A' shape waveform indicated by a dotted line in FIG. 2, but the example embodiments are not limited thereto. On the other hand, when the droop occurs, the second power voltage VDD2 using the adaptive clock signal may be restored to a 'B' shape waveform as shown in FIG. 2, but the example embodiments are not limited thereto.

When the digital droop detector 100 of at least one example embodiment of the inventive concepts is used, it is expected that a margin of the power supply voltage VDD may be reduced because substantially high resolution and/or higher resolution droop detection is possible.

Figure 3:
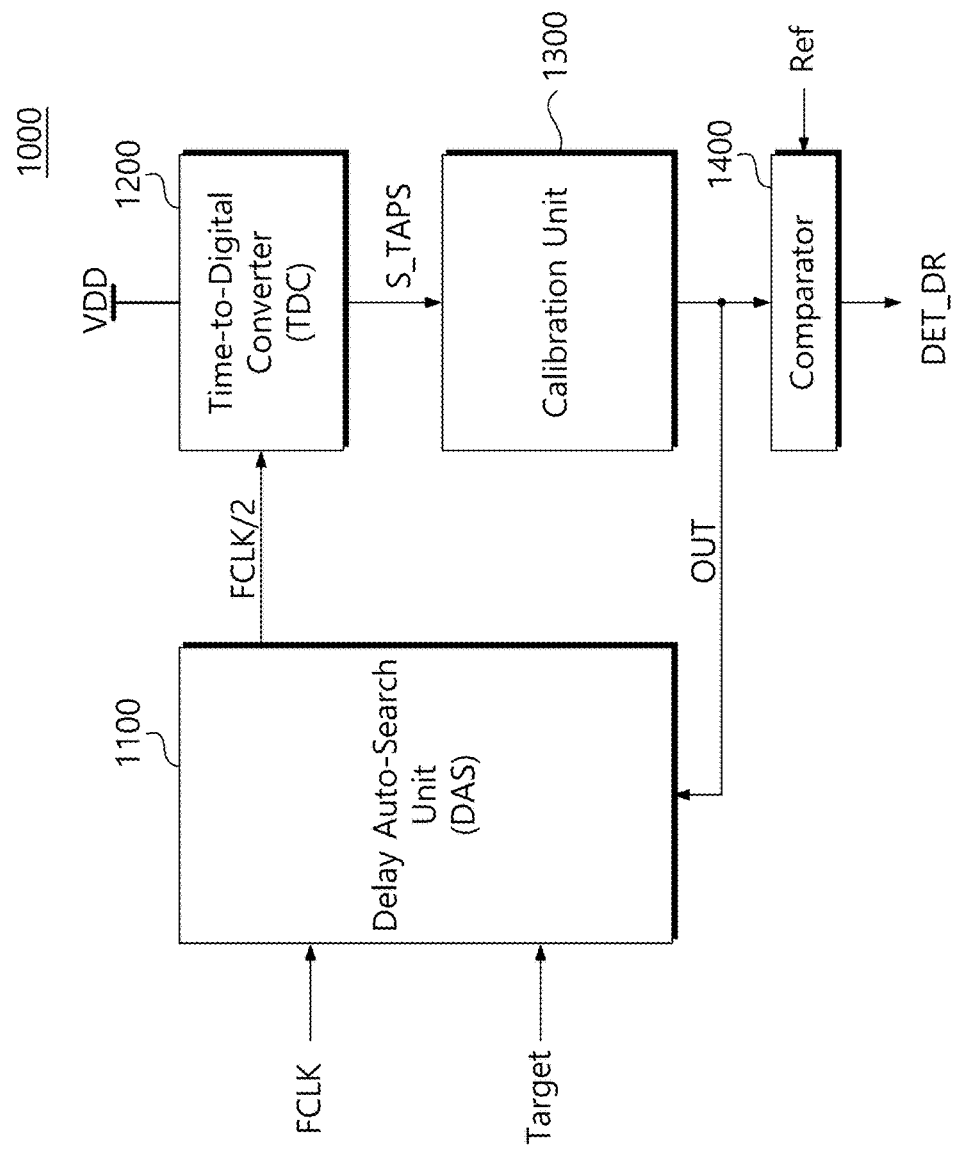
FIG. 3 is a block diagram schematically showing the configuration of a digital droop detector according to at least one example embodiment of the inventive concepts.

FIG. 3 is a block diagram schematically showing the configuration of a digital droop detector according to at least one example embodiment of the inventive concepts. Referring to FIG. 3, the digital droop detector 1000 includes a Delay Auto-Search DAS unit 1100 (e.g., DAS circuit, DAS block, etc.), a time-digital converter TDC 1200 (e.g., TDC circuit, TDC block, etc.), a calibration unit 1300 (e.g., calibration circuit, calibration block, etc.), and/or a comparator 1400 (e.g., comparator circuit, comparator block, etc.), etc., but the example embodiments are not limited thereto.

The DAS unit 1100 adjusts the delay of the clock signal FCLK/2 by comparing the output code OUT and the target range before the digital droop detector 1000 operates, or in other words, the DAS unit 1100 adjusts, sets, and/or modifies the delay of the clock signal FCLK/2 based on the output code OUT and a desired target range, etc., but is not limited thereto. That is, the DAS unit 1100 adjusts the delay of the clock signal FCLK/2 so that the output code (e.g., S_TAPS or OUT) of the time-to-digital converter 1200 is not saturated, or in other words, the output code is not above or below the desired target range, etc. When the delay of the clock signal FCLK/2 is adjusted, the output code (e.g., S_TAPS or OUT) is located within the target range corresponding to the power supply voltage VDD. In summary, the DAS unit 1100 initializes the delay of the clock signal FCLK/2 so that the output code (e.g., S_TAPS or OUT) value corresponding to the level of the power supply voltage VDD applied to the corresponding digital droop detector 1000 converges to the target range, etc.

The time-to-digital converter 1200 converts the delay of the clock signal FCLK/2 corresponding to the power supply voltage VDD into a code S_TAPS of a plurality of bits (e.g., 192-bit, etc.), but the example embodiments are not limited thereto. The time-to-digital converter 1200 converts a gate delay of a buffer that is affected by a voltage level change of the power supply voltage VDD into a bit string. In order to increase the resolution, the time-to-digital converter 1200 may use a plurality of phase interpolators (hereinafter, PI), but is not limited thereto. The value of output code S_TAPS of the time-to-digital converter 1200 depends on and/or is based on the level of the power supply voltage VDD and the characteristics of the clock signal FCLK/2, etc.

The calibration unit 1300 compensates (e.g., adjusts, etc.) the output code S_TAPS of the time-digital converter 1200 according to and/or based on a process variation (e.g., a defect, characteristic, and/or variation in the semiconductor device caused by the manufacturing process, etc.) and/or a temperature variation (e.g., a change in operating temperature of the semiconductor device, etc.) of the digital droop detector 100, the function block 200, and/or the semiconductor device 10, etc., but the example embodiments are not limited thereto. A gate delay of a buffer used in the time-digital converter 1200 may be affected by a process variation and/or a temperature variation, etc. Therefore, unless compensation for such process variations and/or temperature variations is applied, it is difficult to uniformly calculate and/or control the output code S_TAPS. Therefore, the calibration unit 1300 compensates for the change according to and/or the process and/or temperature through appropriate characteristic adjustments, and provides the output code OUT. The configuration and/or characteristics of the calibration unit 1300 and the calibration method will be described in detail with reference to the drawings to be described later.

The comparator 140 compares the output code OUT with the reference value Ref to generate a droop detection signal DET_DR, but is not limited thereto. If a droop occurs and the voltage level of the power supply voltage VDD becomes less than the reference value Ref, the drop in the voltage level of the power supply voltage VDD is reflected in the output code OUT. And when the value of the output code OUT becomes smaller than the reference value Ref, the comparator 140 generates a droop detection signal DET_DR to trigger a frequency adjustment of the clock signal FCLK.

A brief configuration of the digital droop detector 1000 of at least one example embodiment of the inventive concepts has been described above. In the digital droop detector 1000 of at least one example embodiment of the inventive concepts, the output code OUT value may be adjusted to a target range by the DAS unit 1100, etc. Then, the gate delay according to and/or based on the process and/or temperature variation may be compensated for by the calibration unit 1300. Accordingly, the digital droop detector 1000 is capable of high-accuracy droop detection in which process and/or temperature variation is compensated. According to some example embodiments, one or more of the DAS unit 1100, the TDC 1200, the calibration unit 1300, and/or the comparator 1400, etc., may be implemented as processing circuitry, may be combined into one or more circuits and/or modules, etc.

Figure 4:
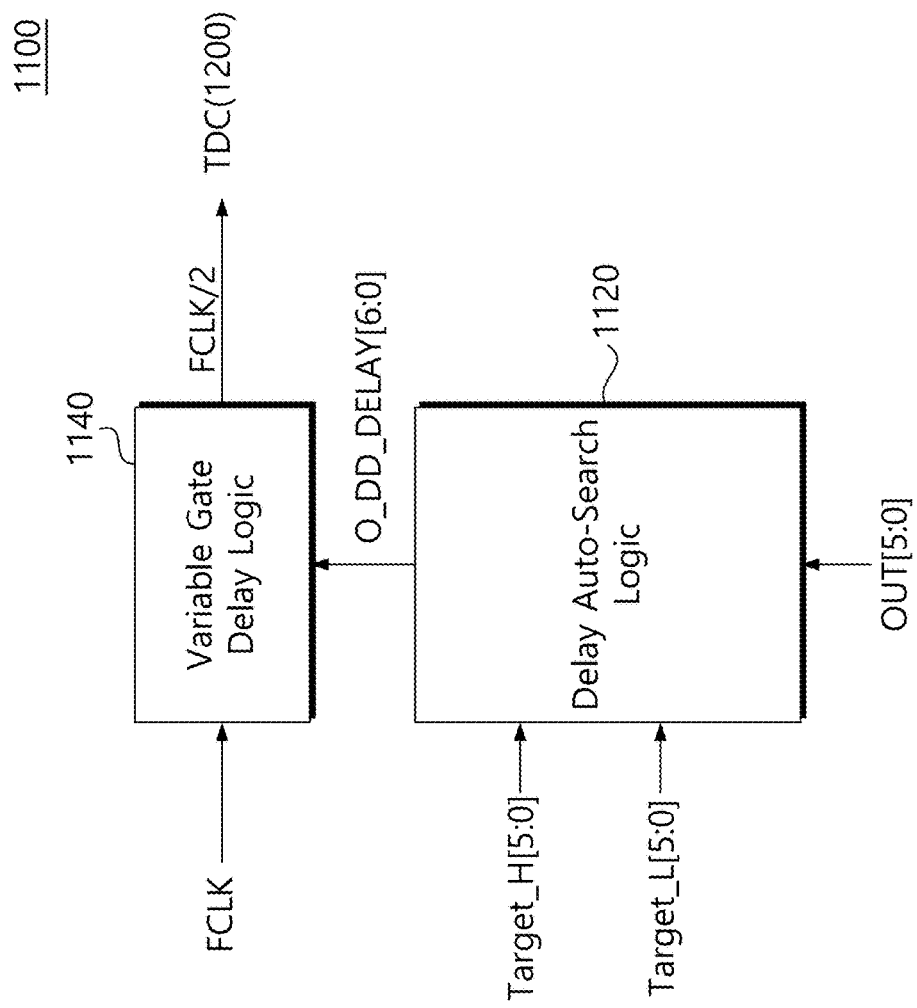
FIG. 4 is a block diagram illustrating the delayed automatic search (DAS) unit of FIG. 3 in more detail according to at least one example embodiment.

FIG. 4 is a block diagram illustrating the delayed automatic search DAS unit of FIG. 3 in more detail according to at least one example embodiment. Referring to FIG. 4, the DAS unit 1100 may include a DAS logic 1120 (e.g., DAS logic circuit, DAS logic block, etc.) and/or a variable gate delay logic 1140 (e.g., variable gate delay logic circuit, variable gate delay block, etc.), etc., but is not limited thereto. Additionally, the DAS logic 1120 and/or the variable gate delay logic 1140 may be implemented as processing circuitry and/or may be combined into a single circuit and/or module, etc.

The DAS logic 1120 determines whether the value of the output code, e.g., OUT[5:0], etc., output from the calibration unit 1300 is included in the target range (e.g., Target_L[5:0] to Target_H[5:0]), etc., but the example embodiments are not limited thereto, and for example, the output code and/or the target range may have a greater or lesser number of bits. If the value of the output code OUT[5:0] is outside of the target range (Target_L[5:0]~Target_H[5:0]), the DAS logic 1120 generates the delay adjustment signal (e.g., O_DD_DELAY[6:0]) and passes it to the variable gate delay logic 1140, etc., but the example embodiments are not limited thereto, and for example, the delay adjustment signal may have a different length. If the value of the output code OUT[5:0] is lower than the target lower limit value (Target_L[5:0]), the DAS logic 1120 generates a delay adjustment signal O_DD_DELAY[6:0] to adjust the delay of the clock signal FCLK/2 in the direction of increasing the magnitude of the output code OUT[5:0], or in other words, the DAS logic 1120 may increase the delay of the clock signal FCLK/2 in response to the value of the output code OUT[5:0] being lower than the target lower limit value, etc. In other words, the DAS logic 1120 may generate a delay adjustment signal O_DD_DELAY[6:0] for increasing (and/or causing) the delay of the clock signal FCLK/2, etc.

The variable gate delay logic 1140 divides the basic clock signal FCLK for driving the digital droop detector 1000 to generate the clock signal FCLK/2, etc. In addition, the variable gate delay logic 1140 may vary and/or adjust the delay of the clock signal FCLK/2 according to and/or based on the delay adjustment signal O_DD_DELAY[6:0], etc. For example, the variable gate delay logic 1140 may decrease or increase the delay of the clock signal FCLK/2 in response to the delay adjustment signal O_DD_DELAY[6:0], and may transmit the clock signal FCLK/2 to the time-to-digital converter 1200, etc., but is not limited thereto.

According to the above-described at least one example embodiment of the DAS unit 1100, the delay of the clock signal FCLK/2 may be initialized so that the output of the time-to-digital converter 1200 is not saturated before the process and/or temperature changes have been compensated.

Figure 5:
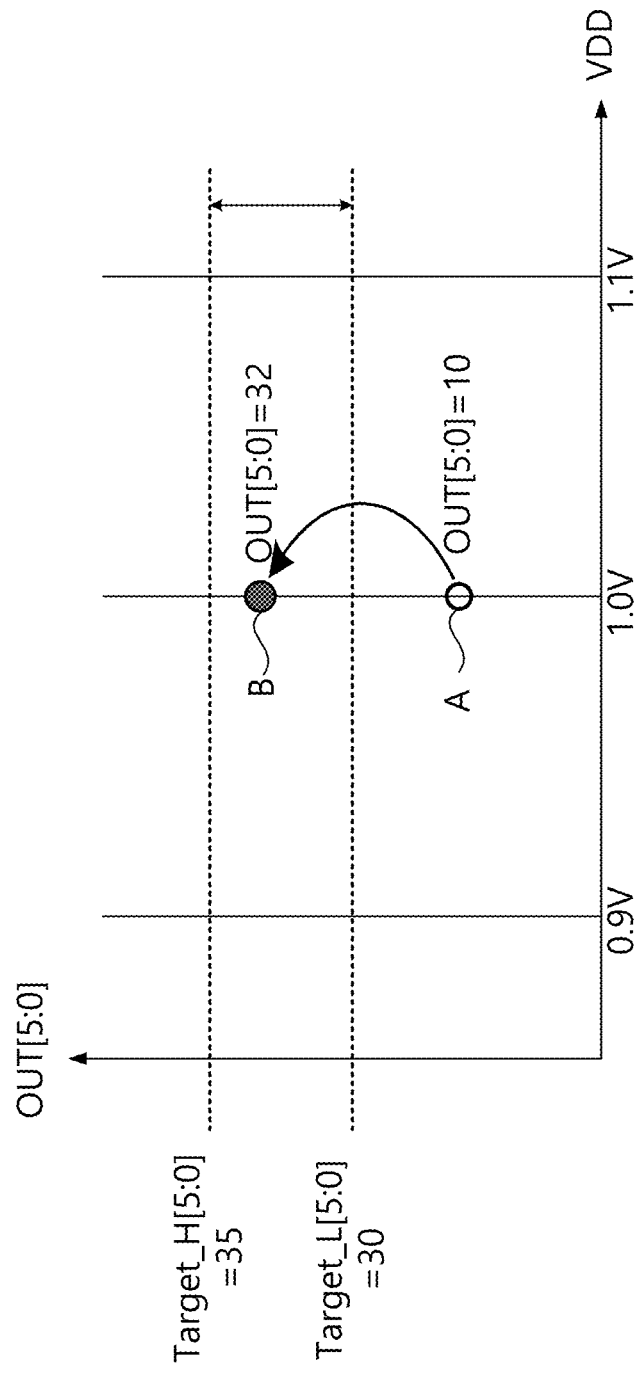
FIG. 5 is a graph visually showing a setting operation of the delayed automatic search (DAS) unit of FIG. 4 according to at least one example embodiment.

FIG. 5 is a graph visually showing a setting operation of the delayed automatic search DAS unit of FIG. 4 according to at least one example embodiment. Referring to FIG. 5, it is assumed that the decimal value of the output code OUT[5:0] corresponds to '10' under the condition of the power supply voltage VDD having a magnitude of 1.0V, but the example embodiments are not limited thereto.

Under normal operating conditions, the output code (OUT[5:0]) output by the clock signal (FCLK/2) of the 1.0V power supply voltage (VDD) is within the target range of decimal values '30' and '35' (Target_L[5:0]~Target_H[5:0]), etc., but the example embodiments are not limited thereto. However, the output code (OUT[5:0]) before a process/temperature compensation has been performed corresponds to the '10' located at the 'A' point, so adjustment, correction, and/or compensation is desired and/or required. Thus, the delay of clock signal (FCLK/2) should be adjusted so that the output code (OUT[5:0]) is moved to point 'B' of size '32' within the target range (Target_L[5:0] to Target_H[5:0]), but the example embodiments are not limited thereto. To this end, the DAS logic 1120 generates a delay adjustment signal O_DD_DELAY[6:0] and transmits the delay adjustment signal to the variable gate delay logic 1140, etc. Then, the variable gate delay logic 1140 adjusts the delay of the clock signal FCLK/2 in a direction in which the value of the output code OUT[5:0] is changed to a magnitude of '32', etc.

In the illustrated example of FIG. 5, although an example power supply voltage VDD of 1.0V has been described, the delay of the clock signal FCLK/2 may be adjusted in a similar manner even when the power supply voltage VDD is not 1.0V, e.g., VDD is 0.9V or 1.1V, etc.

Figure 6:
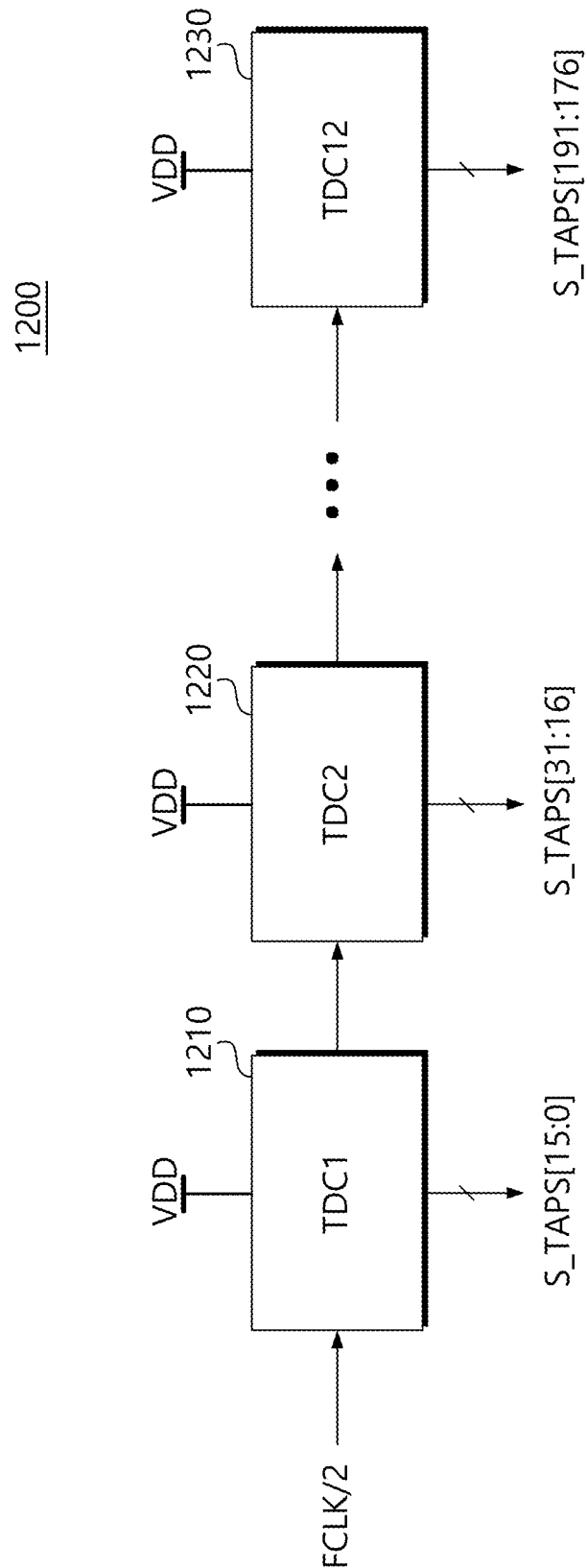
FIG. 6 is an example block diagram showing the structure of the time-to-digital converter (TDC) of FIG. 3 according to at least one example embodiment.

FIG. 6 is an example block diagram showing the structure of the time-to-digital converter TDC of FIG. 3 according to at least one example embodiment. Referring to FIG. 6, the time-to-digital converter 1200 may generate a TDC output code S_TAPS[191:0] through a serial connection to the clock signal FCLK/2 of the plurality of TDC units 1210, 1220 and/or 1230, etc., but the example embodiments are not limited thereto, and for example, there may be a greater or lesser number of TDC units, etc. Additionally, the TDC 1200 and/or the TDC units 1210, 1220, and 1230, etc. may be implemented as processing circuitry and/or may be combined into a single circuit and/or module, etc.

Each of the TDC units 1210, 1220, and/or 1230, etc., includes at least one buffer, etc., but is not limited thereto. Each of the TDC units 1210, 1220, and 1230 generates respective output codes using a phase interpolation technique which divides gate delays appearing at both ends of the respective buffer. For example, to generate a 192-bit long TDC output code (e.g., S_TAPS[191:0]), twelve TDC units TDC1 to TDC12 each outputting 16-bit length output codes (e.g., S_TAPS[15:0], S_TAPS[31:16], . . . , S_TAPS[191:176]) may be used, etc., but the example embodiments are not limited thereto. For example, each of the twelve TDC units TDC1 to TDC12 may interpolate by $\frac{1}{16}$ times the gate delay generated in the buffer, etc. That is, the gate delay occurring in one buffer may be generated as a code subdivided into 16 pieces, etc., but the example embodiments are not limited thereto.

Figure 7:
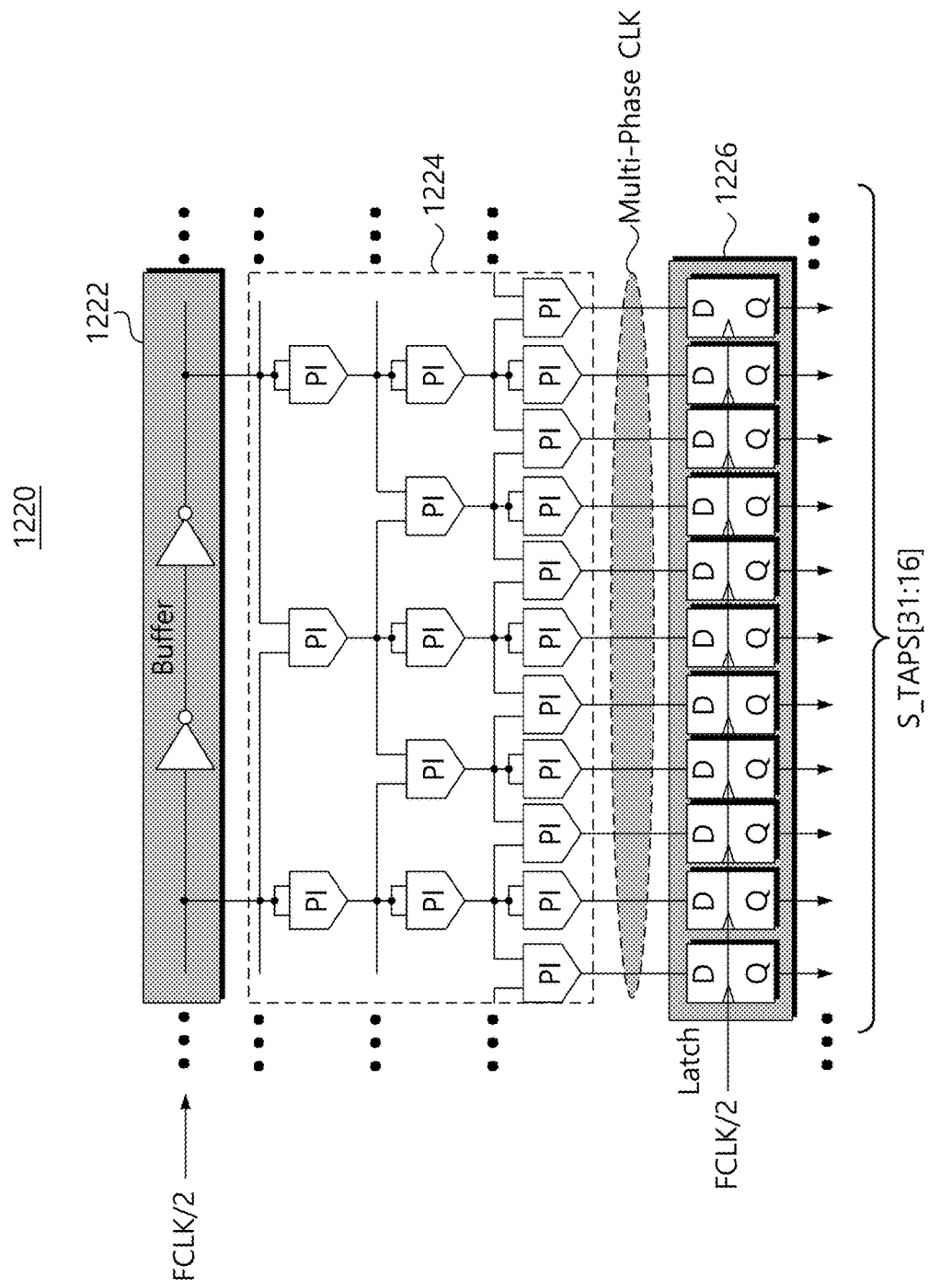
FIG. 7 is a diagram showing in detail the configuration of any one of the TDC units of FIG. 6 according to at least one example embodiment.

FIG. 7 is a diagram showing in detail the configuration of any one of the TDC units of FIG. 6 according to at least one example embodiment. Referring to FIG. 7, a TDC unit 1220 among a plurality of TDC units is illustrated by way of example. The TDC unit 1220 includes a buffer 1222, a phase interpolator PI chain 1224, and/or a latch unit 1226, etc., but is not limited thereto.

The buffer 1222 provides a specific and/or desired delay for clock signal FCLK/2, but is not limited thereto. That is, a gate delay occurs between the clock signal FCLK/2 being received at the input terminal of the buffer 1222 and the clock signal FCLK/2 being output by the output terminal of the buffer 1222, etc. This corresponds to the gate delay of the plurality of inverters included in the buffer 1222, etc., but the example embodiments are not limited thereto.

The phase interpolator (hereinafter, PI) chain 1224 converts the gate delay between the input and output terminals of the buffer 1222 into a finer sub-gate delay (e.g., smaller sub-gate delay, etc.). The PI chain 1224 generates a multi-phase clock (e.g., Multi-Phase CLK) using a phase interpolator PI comprised of multiple layers, but the example embodiments are not limited thereto. For example, the multi-phase clock may divide the gate delay between the input and output terminals of the buffer 1222 by, for example, 1/16, but is not limited thereto. For the sake of convenience of explanation and clarity, three layers are shown in the illustrated drawings, but the example embodiments are not limited thereto. For example, if a phase interpolator PI including four layers is used, it is possible to create sub-gate delays obtained by dividing the gate delay between the input and output terminals of the buffer 1222 by 1/32, etc.

The latch unit 1226 latches the multi-phase clock (e.g., Multi-Phase CLK) at the rising edge of the clock signal FCLK/2, but the example embodiments are not limited thereto, and for example, the latch unit 1226 may latch the multi-phase clock at the falling edge, etc., of the clock signal FCLK/2. For example, when a bit string of the multi-phase clock (e.g., Multi-Phase CLK) is '0000000000111111', the latch unit 1226 latches the bit value of the multi-phase clock in response to the clock signal FCLK/2 to output. At this time, the output bit string is a 16-bit TDC output code S_TAPS[31:16]. And when twelve of these TDC output codes are combined, a 192-bit TDC output code (e.g., S_TAPS[191:0]) is generated. The TDC output code (e.g., S_TAPS[191:0]) is affected by the voltage level of the power supply voltage VDD. For example, when a droop occurs, it is possible to check and/or detect whether the droop has occurred by detecting the magnitude of change in the TDC output code (e.g., S_TAPS[191:0]), etc.

Figure 8:
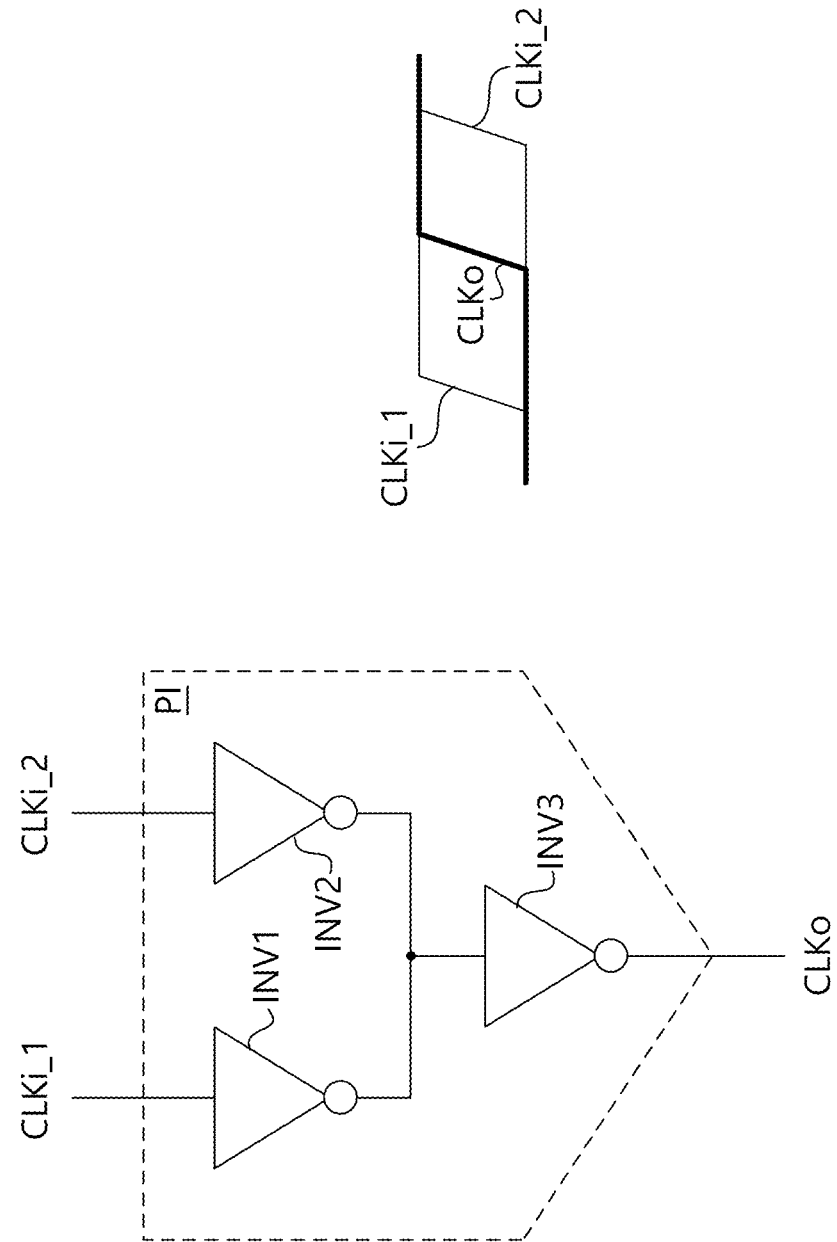
FIG. 8 is an example diagram showing the configuration of the phase interpolator of FIG. 7 according to at least one example embodiment.

FIG. 8 is an example diagram showing the configuration of the phase interpolator PI of FIG. 7 according to at least one example embodiment. Referring to FIG. 8, the phase interpolator PI includes a plurality of inverters INV1, INV2, and/or INV3, etc., but the example embodiments are not limited thereto, and for example, may have a greater or lesser number of inverters, etc.

The inverters INV1 and INV2 receive two input clocks CLKi_1 and CLKi_2 input to the phase interpolator PI, respectively, but the example embodiments are not limited thereto. And the inverters INV1 and INV2 invert the two input clocks CLKi_1 and CLKi_2, etc. The outputs of the inverted inverters INV1 and INV2 are combined in a wired or manner and input to the inverter INV3, etc. Then, the inverter INV3 inverts the input signal and provides an output as the output clock CLKo, etc.

The operation of the phase interpolator PI divides the delay difference between the two input clocks CLKi_1 and CLKi_2 by half as shown in the waveform shown on the right of FIG. 8, according to at least one example embodiment. That is, the phase interpolator PI divides by half the delay difference (e.g., halves the delay difference, etc.) between the input clock CLKi_1 transitioning to the high level first and the input clock CLKi_2 transitioning to the high level later, but the example embodiments are not limited thereto. By connecting the phase interpolators PI in this way in a cascade manner, the two input clocks CLKi_1 and CLKi_2 may be divided into finer and/or other desired delay sizes, etc.

Figure 9:
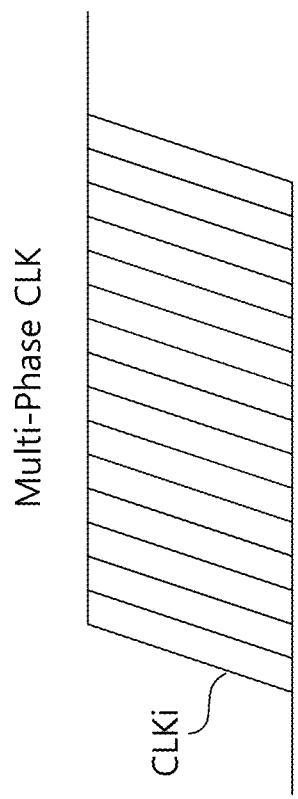
FIG. 9 is a waveform diagram showing a division form of the multi-phase clock (Multi-Phase CLK) of FIG. 7 according to at least one example embodiment.

FIG. 9 is a waveform diagram showing a division form of the multi-phase clock (e.g., Multi-Phase CLK) of FIG. 7 according to at least one example embodiment. Referring to FIG. 9, when the phase interpolators PI are connected in a cascade manner in a plurality of layers, the delay of the clock signal may be made finer sub-gate delays. That is, the delay of the input clock CLKi of the buffer may be generated based on a plurality of sub-gate delays by the phase interpolator PI chain 1224, etc.

Figure 10:
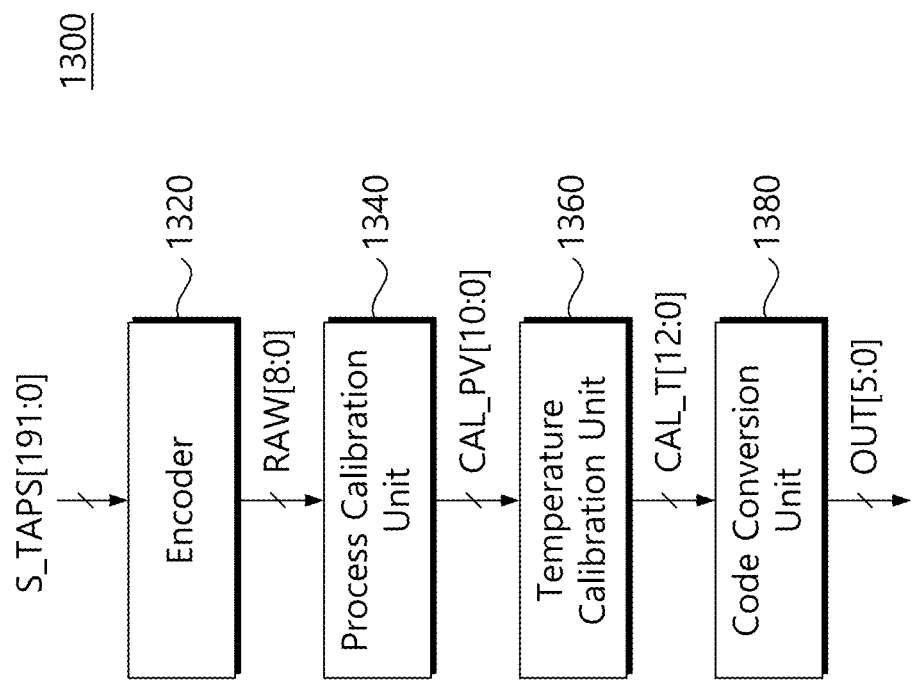
FIG. 10 is a block diagram schematically illustrating a detailed configuration of the calibration logic of FIG. 3 according to at least one example embodiment.

FIG. 10 is a block diagram schematically illustrating a detailed configuration of the calibration logic of FIG. 3 according to at least one example embodiment. Referring to FIG. 10, the calibration logic 1300 includes an encoder 1320, a process calibration unit 1340 (e.g., process calibration circuit, process calibration block, etc.), a temperature calibration unit 1360 (e.g., temperature calibration circuit, temperature calibration block, etc.), and/or a code conversion unit 1380 (e.g., code conversion circuit, code conversion block, etc.), etc., but the example embodiments are not limited thereto, and for example, the calibration logic may include a greater or lesser number of constituent elements. Additionally, one or more of the calibration logic 1300, the encoder 1320, the process calibration unit 1340, the temperature calibration unit 1360, and/or the code conversion unit 1380, etc., may be implemented as processing circuitry and/or may be combined into a single circuit and/or module, etc.

The encoder 1320 converts the TDC output code (e.g., S_TAPS[191:0]) output from the time-digital converter 1200 into a raw code (e.g., RAW[8:0]) including at least one sign bit, etc. The TDC output code (e.g., S_TAPS[191:0]) is a bit string composed of consecutive logic '1's and logic '0's (e.g., a binary code), but the example embodiments are not limited thereto. For example, the 192-bit TDC output code (e.g., S_TAPS[191:0]) is provided in the same form as the bit string of '00000 . . . 0001111 . . . 111111', but is not limited thereto. That is, the TDC output code (e.g., S_TAPS[191:0]) is provided as information on the transition timing between the logic '0' and the logic '1' according to and/or based on the division of the clock signal FCLK/2. Such data may be converted into a short-length raw code (e.g., RAW[8:0]) including a sign bit by the encoder 1320, etc.

The process calibration unit 1340 converts a nonlinear characteristic (e.g., a nonlinear slope value) according to (and/or based on, caused by, associated with, etc.) a process change (e.g., a process defect, a manufacturing defect, a fabrication characteristic, etc.) into a linear characteristic (e.g., a linear slope) with respect to the raw code RAW[8:0], but is not limited thereto. For example, the process calibration unit 1340 corrects the nonlinearity of the raw code (e.g., RAW[8:0]) for each process speed by using a three-point calibration technique, but the example embodiments are not limited thereto. For example, the process calibration unit 1340 may check the code values of the raw codes RAW[8:0] for each process speed at a plurality of power supply voltages VDD of, e.g., 0.9V, 1.0V, and/or 1.1V, etc. In addition, when the code values at these three points (e.g., the three power supply voltage values) are not linear, the process calibration unit 1340 corrects these code values to have desired linear characteristics in the linear form.

A correction operation logic for correction of the process calibration unit 1340 may be provided in the process calibration unit 1340, but the example embodiments are not limited thereto. Additionally, an operation for correction of the process calibration unit 1340 may be performed in a separate system provided outside (and/or external to) the digital droop detector 1000, etc. In addition, an external calculation result may be input to the process calibration unit 1340 to set the process calibration unit 1340, etc. Additionally, data for use in the correction of the process calibration unit 1340 based on previously accumulated data may be implemented as a lookup table provided in the process calibration unit 1340, but the example embodiments are not limited thereto. A correction result according to the process speed of the process calibration unit 1340 is output as a process correction code CAL_PV [10:0], but is not limited thereto.

The temperature calibration unit 1360 converts the process correction code CAL_PV[10:0] into a linear characteristic (e.g., a linear slope) by compensating for the non-linear characteristic according to (and/or based on, caused by, associated with, etc.) the temperature (e.g., the current operating temperature of the semiconductor device, the functional block, etc.). For example, the temperature calibration unit 1360 uses a two-point technique to correct for temperature-dependent nonlinearity, but is not limited thereto. For example, the temperature calibration unit 1360 may check the code values for each temperature at the power supply voltages VDD of 0.9V and 1.1V, etc., but is not limited thereto. In addition, the temperature calibration unit 1360 corrects these code values to have a linear characteristic (e.g., slope) of a straight line when the code values at these two points are not linear, etc.

Calculations of the correction of the temperature calibration unit 1360 may be performed inside the temperature calibration unit 1360 like the process calibration unit 1340, but is not limited thereto. Additionally, the temperature correction operation of the temperature calibration unit 1360 may be performed outside (and/or external to) the digital droop detector 1000 and the temperature calibration unit 1360 may be corrected according to and/or based on the result of the operation, etc. Additionally, coefficients for correction of the temperature calibration unit 1360 based on previously accumulated data may be implemented as a lookup table (LUT) provided in the temperature calibration unit 1360, but the example embodiments are not limited thereto. The correction result according to and/or based on the temperature of the temperature calibration unit 1360 is output as a temperature correction code CAL_T[12:0]. Additionally, it is noted that the temperature correction code CAL_T[12:0] includes data which has been corrected for the process variation and temperature change, etc.

The code conversion unit 1380 converts the temperature correction code CAL_T[12:0], which is output by correcting a nonlinearity with respect to process variations and/or temperature change, into an output code OUT[5:0] of, for example, a 6-bit size, but the example embodiments are not limited thereto. As described above, the TDC output code (e.g., S_TAPS[191:0]) is encoded into a 9-bit raw code (e.g., RAW[8:0]), but the example embodiments are not limited thereto. Then, the raw code (e.g., RAW[8:0]) is converted into an 11-bit process correction code (e.g., CAL_PV[10:0]) including a sign bit and a redundant bit, but is not limited thereto. The process correction code (e.g., CAL_PV[10:0]) is converted to a 13-bit temperature correction code (e.g., CAL_T[12:0]) with redundant bits, but is not limited thereto. In the correction process, the code size is increased by 2-bits, etc. Finally, the code conversion unit 1380 removes the redundant bits and generates a 6-bit output code (e.g., OUT[5:0]) including only desired and/or necessary information, but the example embodiments are not limited thereto.

Figure 11A:
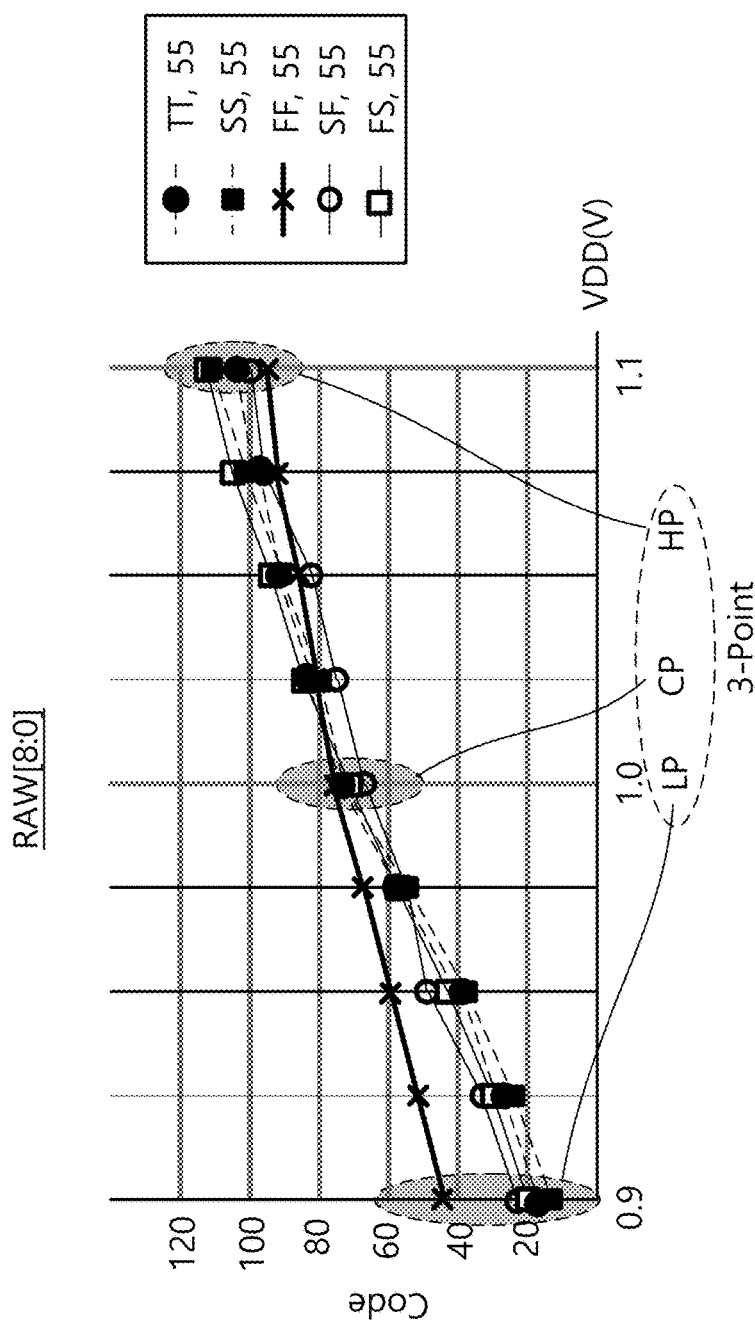
FIGS. 11A to 11C are graphs each showing a correction process performed in the process calibration unit of FIG. 10 according to at least one example embodiment.
Figure 11B:
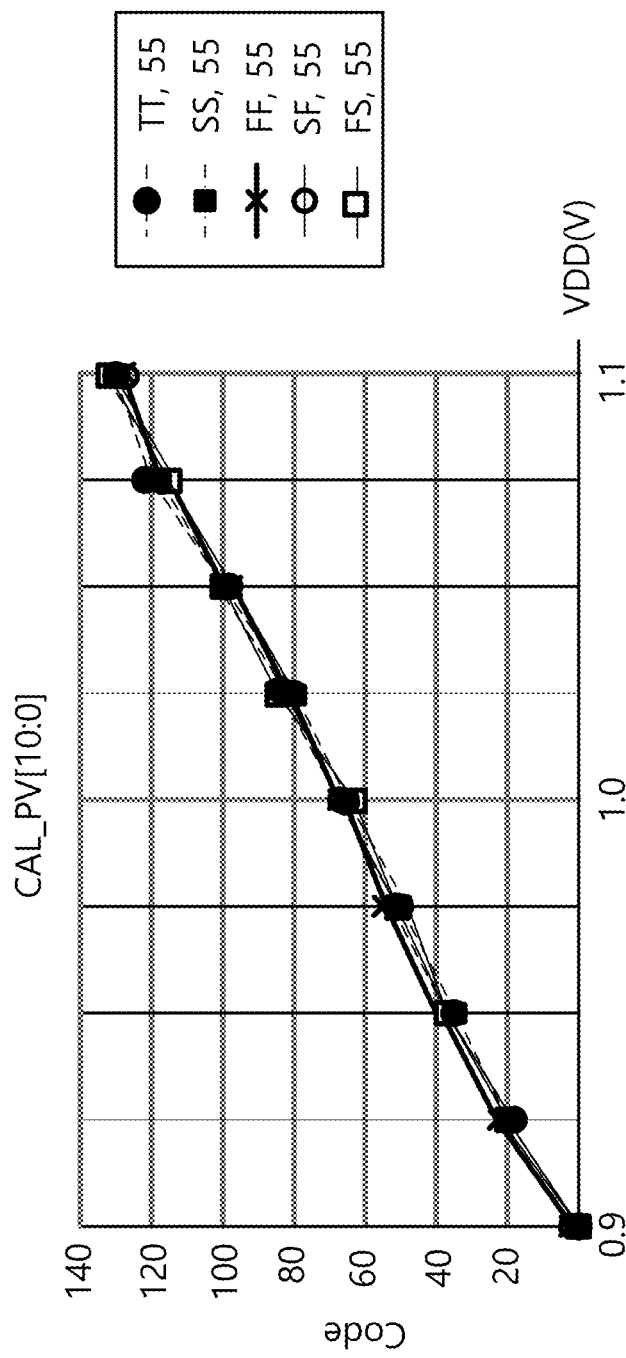
Figure 11C:
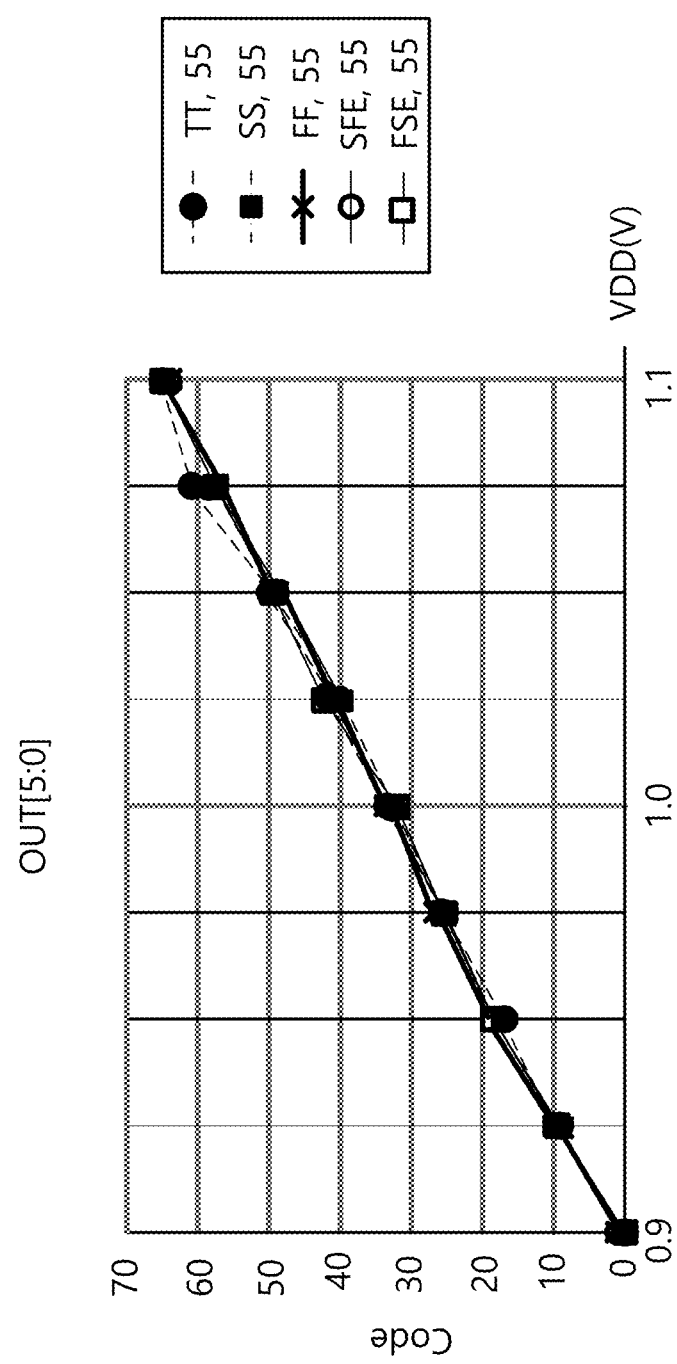

FIGS. 11A to 11C are graphs each showing a correction process performed in the process calibration unit of FIG. 10 according to some example embodiments. A three-point calibration scheme will be described with reference to FIGS. 11A to 11C, but the example embodiments are not limited thereto, and other calibration schemes may be used, etc.

Referring to FIG. 11A, the process calibration unit 1340 receives a raw code (e.g., RAW[8:0]) including a sign bit provided from the encoder 1320, but is not limited thereto, and for example, the size of the raw code and/or the sign bit may differ and/or the sign bit may be omitted.

The size of the raw code (RAW[8:0]) should be corrected to maintain substantial linearity, e.g., for example, +/−10% of linearity, etc. However, the raw code (RAW[8:0]) for each process speed (e.g., TT, SS, FF, SF, FS, etc.) shows different slopes and/or non-linearity characteristics. For example, at the 'TT' process speed where both NMOS and PMOS transistors exhibit typical (e.g., average) speed at a temperature of approximately 55° C., the raw code (RAW[8:0]) may be approximately '18' at 0.9V, approximately '65' at 1.0V, and approximately '103' at 1.1V, etc., but the example embodiments are not limited thereto. In addition, at the 'FF' process speed, where the speed of both the NMOS and PMOS transistors are relatively fast at a temperature of approximately 55° C., the raw code (e.g., RAW[8:0]) may be determined to be approximately '42' at 0.9V, approximately '75' at 1.0V, approximately '93' at 1.1V, etc., but is not limited thereto. As described above, the characteristics of the raw code RAW[8:0] should be linear with respect to the power supply voltage VDD, but the actual characteristic function (e.g., actual performance, etc., of the semiconductor device) may have different slopes and/or different magnitudes of constant values depending on the process speed.

In order to correct the nonlinearity of the raw code (e.g., RAW[8:0]) for each process speed, the process calibration unit 1340 may apply a three-point correction technique, but is not limited thereto. That is, the code size of three points, e.g., a low point LP, a mid-point CP, and a high point HP, of the raw code (e.g., RAW[8:0]) may be detected for each process speed, but the example embodiments are not limited thereto. And by using the three points, the function characteristics of the raw code (e.g., RAW[8:0]) may be identified for each process speed. In addition, a correction of the nonlinearity of the raw code may be performed wherein the raw code is converted into a linear function having a reference slope for the identified function may be performed, etc. Calibration with such a linear function may be performed for each process speed.

Referring to FIG. 11B, the form of the process correction code CAL_PV[10:0] corrected for each process speed by the process calibration unit 1340 is briefly illustrated, but the example embodiments are not limited thereto. By applying the 3-point correction technique, the function of the raw code (e.g., RAW[8:0]) for each process speed is corrected in the form of linear functions having the same slope (and/or desired slope, etc.). In FIG. 11A, it can be seen that the process correction codes CAL_PV[10:0] of the 'TT' process speed and the 'FF' process speed respectively have different slopes and sizes are corrected with the same and/or substantially the same (e.g., slopes which are within +/−10% of each other, etc.) slopes, etc., but the example embodiments are not limited thereto. In addition, the process correction code CAL_PV[10:0] was corrected to show the same linearity regardless of the process speed in the power supply voltage VDD section of 0.9V and 1.1V, etc., but the example embodiments are not limited thereto.

Referring to FIG. 11C, the linear characteristic for each process speed of the process correction code CAL_PV[10:0] will be maintained even in the calibration unit 1300 output code OUT[5:0] after a temperature correction has been made.

According to the operation of the process calibration unit 1340 of at least one example embodiment of the inventive concepts described above, the output value of the time-to-digital converter 1200 may be corrected using the process correction code CAL_PV[10:0] in which the effect of the process change is compensated.

Figure 12A:
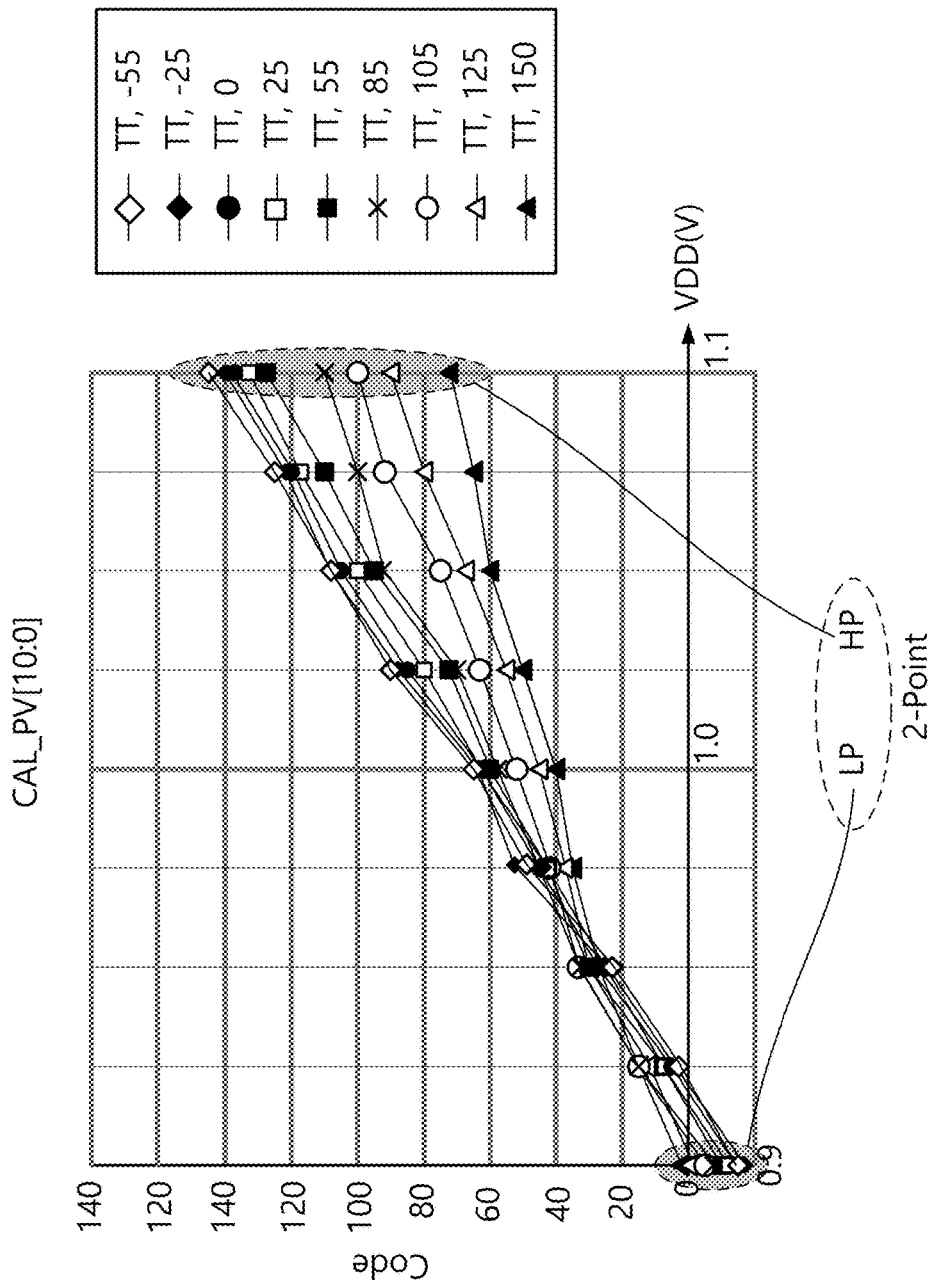
FIGS. 12A to 12B are graphs each showing a correction process performed in the temperature calibration unit of FIG. 10 according to at least one example embodiment.
Figure 12B:
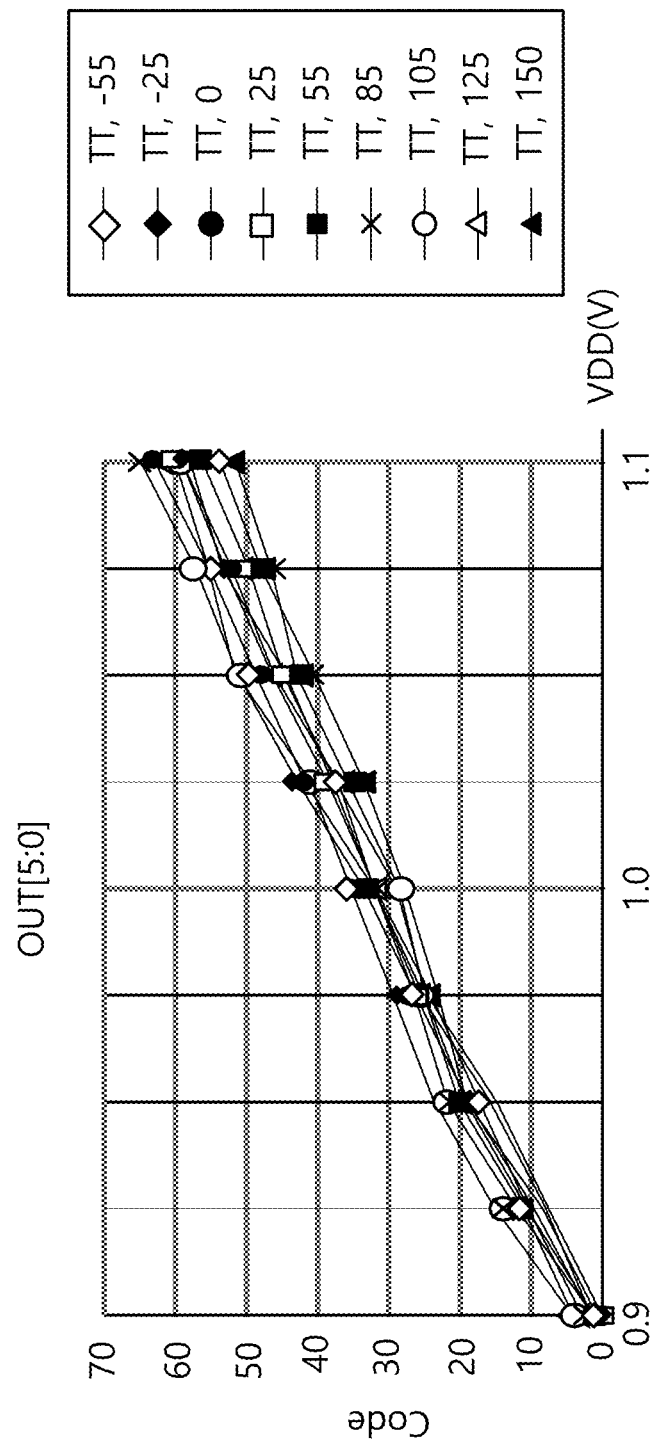

FIGS. 12A to 12B are graphs each showing a correction process performed in the temperature calibration unit of FIG. 10 according to at least one example embodiment. A two-point calibration scheme for temperature compensation will be described with reference to FIGS. 12A to 12B, but the example embodiments are not limited thereto.

Referring to FIG. 12A, according to at least one example embodiment, the temperature calibration unit 1360 receives from the process calibration unit 1340 the process correction code CAL_PV[10:0] to which the correction operation for the process change is applied, but the example embodiments are not limited thereto. The process correction code CAL_PV[10:0] for each of the temperatures exhibits different slope characteristics with respect to the power supply voltage VDD because compensation according to and/or based on the change in temperature is not applied. Here, for the sake of convenience of description, the description will be limited to a case in which both the NMOS transistor and the PMOS transistor have the 'TT' process speed characteristic, which is the standard speed, but the example embodiments are not limited thereto, and the temperature compensation may be performed on transistors operating at different process speeds, etc. The process correction code CAL_PV [10:0] at each of the temperatures (e.g., −55° C. to 150° C.) appears with a different slope for each of the temperatures (e.g., −55° C. to 150° C.) with respect to the power supply voltage VDD, etc. However, the code values of the process correction code CAL_PV[10:0] at 0.9V show similar values and are diverged according to and/or based on the increase of the power supply voltage VDD. Therefore, since only the slope needs to be adjusted to compensate for the temperature characteristics of the process correction code CAL_PV[10: 0], a 2-point compensation technique using the code values of the lower point LP and the high point HP may be applied, but the example embodiments are not limited thereto.

Referring to FIG. 12B, the shape of the output code OUT[5:0] output after the inclination for each temperature is corrected by the temperature calibration unit 1360 according to at least one example embodiment is briefly illustrated. By applying the two-point calibration technique, the process calibration code CAL_PV[10:0] is adjusted in the form of a linear function having the same slope as the slope is corrected, but the example embodiments are not limited thereto.

Figure 13:
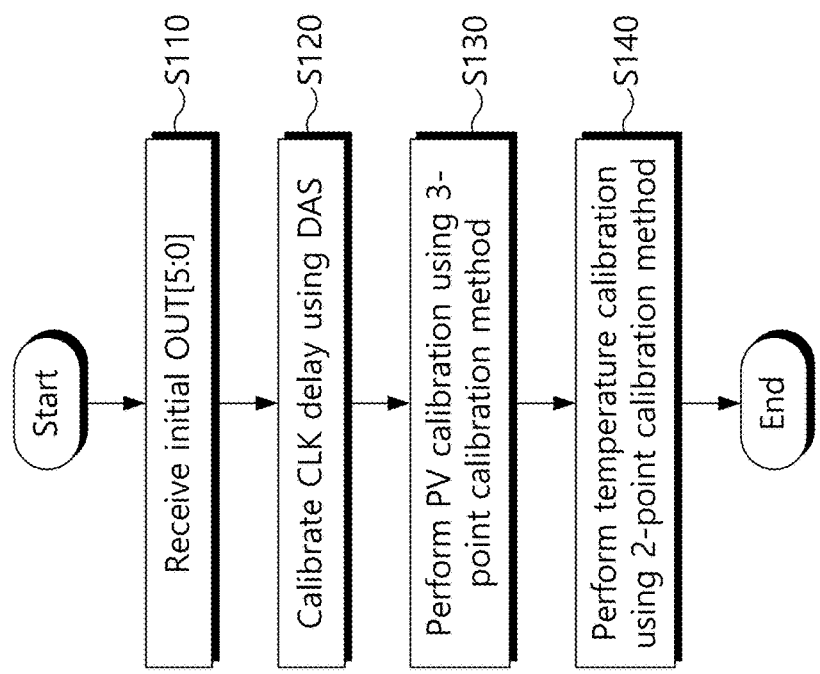
FIG. 13 is a flowchart schematically illustrating a calibration method of a digital droop detector according to according to at least one example embodiment.

FIG. 13 is a flowchart schematically illustrating a calibration method of a digital droop detector according to at least one example embodiment of the inventive concepts. Referring to FIG. 13, the digital droop detector 1000 of at least one example embodiment the inventive concepts may be calibrated using a primary calibration by the DAS unit 1100 and a secondary calibration by the calibration unit 1300, but the example embodiments are not limited thereto.

In operation S110, the DAS unit 1100 receives the output code OUT[5:0] before the digital droop detector 1000 operates. In this case, the output code OUT[5:0] is a value obtained by converting the TDC output S_TAPS[191:0] before the compensation for process change and/or temperature change by the calibration unit 1300 is applied and/or performed, but the example embodiments are not limited thereto.

In operation S120, the DAS logic 1120 of the DAS unit 1100 determines whether the received output code OUT[5:0] is distributed in (and/or located within) the target range (Target_L[5:0]~Target_H[5:0]), etc. When the output code OUT[5:0] is outside the target range (Target_L[5:0]~Target_H[5:0]) (e.g., above or below the target range, etc.), the DAS logic 1120 adjusts the delay of the clock signal FCLK/2 so that the output code OUT[5:0] is within the target range(Target_L[5:0]~Target_H[5:0]).

In operation S130, the process calibration unit 1340 converts the output of the time-digital converter 1200 into a linear characteristic by compensating for a non-linear characteristic according to and/or based on at least one process change. That is, the process calibration unit 1340 corrects the nonlinearity of the output of the time-to-digital converter 1200 for each process speed by using a three-point technique, but the example embodiments are not limited thereto. The process calibration unit 1340 corrects the nonlinearity with respect to the process speed and outputs it as the process correction code CAL_PV[10:0].

In operation S140, the temperature calibration unit 1360 converts the process correction code CAL_PV[10:0] into a linear characteristic by compensating for the nonlinear characteristic according to and/or based on the current temperature. In particular, the temperature calibration unit 1360 may use a two-point technique to correct for temperature-dependent nonlinearity, but the example embodiments are not limited thereto.

As described above, the droop detection accuracy and/or sensitivity of the digital droop detector 1000 may be increased through the double calibration. By providing a high-accuracy droop detection function, the supply voltage VDD margin of the functional block may be reduced, which enables a reduction in power consumption by the functional block, etc.

While various example embodiments of the inventive concepts has been described herein, it will be apparent to those of ordinary skill in the art that various changes and modifications may be made to the example embodiments without departing from the spirit and scope of the inventive concepts as set forth in the following claims.

What is claimed is:

1. A digital droop detector, comprising:
    processing circuitry configured to,
        detect a voltage level change of a power supply voltage in response to a clock signal, the detecting the voltage level change including converting the detected voltage level change into a first code;
        correct at least one nonlinearity included in the first code, the correcting including converting the first code into a second code and a target range; and adjust a delay magnitude of the clock signal based on the second code.

2. The digital droop detector of claim 1, wherein the processing circuitry further includes:
at least one buffer configured to delay the clock signal;
a phase interpolator chain connected to an input terminal and an output terminal of the at least one buffer, respectively, the phase interpolator chain configured to divide a delay time to generate a multi-phase clock signal; and
a latch configured to convert the multi-phase clock signal into the first code by latching the multi-phase clock signal in synchronization with the delayed clock signal.

3. The digital droop detector of claim 2, wherein the phase interpolator chain includes a plurality of phase interpolators connected in a cascade form of a plurality of layers, the plurality of phase interpolators configured to subdivide the delay time between the input and output terminals of the buffer.

4. The digital droop detector of claim 1, the processing circuitry is further configured to:
convert the first code into a raw code including a sign bit;
generate a process correction code by correcting process variation related nonlinearities in the raw code for a plurality of process speeds;
generate a temperature correction code by correcting temperature related nonlinearities in the process correction code for a plurality of temperatures; and
convert the temperature correction code into the second code by adjusting a size of the temperature correction code.

5. The digital droop detector of claim 4, wherein the processing circuitry is further configured to generate the process correction code by using a three-point calibration technique on the raw code, the three-point calibration technique including correcting code values of the raw code associated with each of the plurality of process speeds at three desired voltage levels of the power supply voltage.

6. The digital droop detector of claim 4, wherein the processing circuitry is further configured to generate the temperature correction code by using a two-point calibration technique on the process correction code, the two-point calibration technique including correcting code values of the process correction code associated with each of the plurality of temperatures at two desired voltage levels of the power supply voltage.

7. The digital droop detector of claim 4, wherein the processing circuitry is further configured to generate the process correction code or the temperature correction code using coefficient calculation logic.

8. The digital droop detector of claim 4, wherein the processing circuitry is further configured to generate the process correction code or the temperature correction code using a coefficients lookup table.

9. The digital droop detector of claim 4, wherein the processing circuitry is further configured to include at least one input/output device configured to externally calculate and provide a coefficient for correcting the nonlinearity of the raw code or the process correction code.

10. The digital droop detector of claim 1, wherein the processing circuitry is further configured to:
generate a delay adjustment signal by detecting whether the first code is within the target range; and
adjust the delay of the clock signal based on the delay adjustment signal.

11. The digital droop detector of claim 1, wherein the processing circuitry is further configured to:
compare the second code with a reference value to generate a droop detection signal indicating whether a droop occurs in the power supply voltage.

12. A semiconductor device, comprising:
at least one intellectual property (IP) core configured to receive a power supply voltage to perform at least one processing operation;
a digital droop detector configured to detect a droop of the power supply voltage and output a droop detection signal;
a clock modulation circuit configured to generate an adaptive clock signal based on an input clock signal by varying a frequency of the input clock signal in response to the droop detection signal, and provide the adaptive clock signal to the IP core; and
the digital droop detector is further configured to,
convert a voltage level change of the power supply voltage into a first code, convert at least one nonlinearity included in the first code into a second code based on a target range, and
adjust a delay magnitude of the adaptive clock signal based on the second code.

13. The device of claim 12, wherein the digital droop detector is further configured to generate the first code by using a phase interpolation technique for dividing a delay between an input terminal and an output terminal of a buffer.

14. The device of claim 12, wherein the digital droop detector is further configured to:
convert the first code into a raw code including a sign bit;
determine a process correction code by correcting process variation related nonlinearities in the raw code for a plurality of process speeds;
determine a temperature correction code by correcting temperature related nonlinearities in the process correction code for a plurality of temperatures; and
convert the temperature correction code into the second code by adjusting a size of the temperature correction code.

15. The device of claim 14, wherein the digital droop detector is further configured to determine the process correction code or determine the temperature correction code by receiving the process correction code or the temperature correction code from a coefficient calculating device.

16. The device of claim 14, wherein the digital droop detector is further configured to determine the process correction code or determine the temperature correction code using a lookup table stored in the digital droop detector.

17. The device of claim 12, wherein the digital droop detector is further configured to:
generate a delay adjustment signal by detecting whether the first code is included in the target range; and
adjust a delay of the adaptive clock signal based on the delay adjustment signal.

* * * * *